(12) United States Patent
Yukawa

(10) Patent No.: US 11,670,625 B2
(45) Date of Patent: Jun. 6, 2023

(54) IMAGING UNIT HAVING A STACKED STRUCTURE AND ELECTRONIC APPARATUS INCLUDING THE IMAGING UNIT

(71) Applicant: SONY SEMICONDUCTOR SOLUTIONS CORPORATION, Kanagawa (JP)

(72) Inventor: Masahiko Yukawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 249 days.

(21) Appl. No.: 16/979,592

(22) PCT Filed: Jan. 30, 2019

(86) PCT No.: PCT/JP2019/003160
§ 371 (c)(1),
(2) Date: Sep. 10, 2020

(87) PCT Pub. No.: WO2019/181222
PCT Pub. Date: Sep. 26, 2019

(65) Prior Publication Data
US 2021/0005658 A1 Jan. 7, 2021

(30) Foreign Application Priority Data
Mar. 19, 2018 (JP) .............................. JP2018-051318

(51) Int. Cl.
*H01L 25/16* (2023.01)
*H01L 27/146* (2006.01)
*H01L 23/00* (2006.01)

(52) U.S. Cl.
CPC ............ *H01L 25/167* (2013.01); *H01L 24/08* (2013.01); *H01L 24/32* (2013.01);
(Continued)

(58) Field of Classification Search
None
See application file for complete search history.

(56) References Cited

U.S. PATENT DOCUMENTS 9,362,325 B2 *  6/2016  Baba ................... H01L 27/1469
10,748,879 B2 *  8/2020  Iguchi ................ H01L 25/0753
(Continued)

FOREIGN PATENT DOCUMENTS

CN       109155829 A       1/2019
JP       2009-213012 A     9/2009
(Continued)

OTHER PUBLICATIONS

International Search Report and Written Opinion of PCT Application No. PCT/JP2019/003160, dated Apr. 16, 2019, 09 pages of ISRWO.

*Primary Examiner* — Scott B Geyer
(74) *Attorney, Agent, or Firm* — Chip Law Group

(57) ABSTRACT

Provided is a solid-state imaging unit that includes a stacked structure including a sensor substrate and a circuit board. The sensor board has an effective pixel region where an imaging device is disposed. The imaging device includes a plurality of pixels and is configured to receive external light in each of the pixels to generate a pixel signal. The circuit board includes a chip including a first portion and a second portion that are integrated with each other. The first portion includes a signal processing circuit that performs signal processing of the pixel signal. The second portion is disposed at a position different from a position of the first portion in an in-plane direction. Here, both the first portion and the second portion are disposed to overlap the effective pixel region in a stacking direction of the sensor board and the circuit board.

8 Claims, 17 Drawing Sheets

(52) U.S. Cl.
CPC .... *H01L 27/1469* (2013.01); *H01L 27/14634* (2013.01); *H01L 27/14636* (2013.01); *H01L 2224/08145* (2013.01); *H01L 2224/08221* (2013.01); *H01L 2224/32145* (2013.01)

(56) References Cited

U.S. PATENT DOCUMENTS

| | | | |
|---|---|---|---|
| 10,971,535 B2* | 4/2021 | Kim | H01L 27/1462 |
| 2004/0150081 A1* | 8/2004 | Ogawa | H01L 24/97 |
| | | | 257/678 |
| 2004/0245649 A1* | 12/2004 | Imaoka | H01L 27/1469 |
| | | | 257/E31.128 |
| 2012/0056288 A1* | 3/2012 | Yoshihara | H01L 27/1469 |
| | | | 257/431 |
| 2013/0092820 A1 | 4/2013 | Takemoto | |
| 2015/0221694 A1* | 8/2015 | Baba | H01L 27/14636 |
| | | | 257/443 |
| 2015/0270307 A1 | 9/2015 | Umebayashi et al. | |
| 2015/0279888 A1* | 10/2015 | Chen | H01L 27/14634 |
| | | | 257/459 |
| 2016/0020235 A1* | 1/2016 | Yamashita | H01L 27/14634 |
| | | | 250/206 |
| 2016/0027732 A1* | 1/2016 | Igarashi | H01L 23/5283 |
| | | | 257/531 |
| 2016/0178749 A1* | 6/2016 | Lin | G01S 17/08 |
| | | | 348/302 |
| 2017/0040371 A1 | 2/2017 | Izuhara | |
| 2017/0047369 A1* | 2/2017 | Takahashi | H04N 25/79 |
| 2017/0155865 A1 | 6/2017 | Nakajima et al. | |
| 2018/0091723 A1* | 3/2018 | Funaki | H01L 27/14607 |
| 2018/0138225 A1* | 5/2018 | Kim | H01L 21/76898 |
| 2018/0286910 A1* | 10/2018 | Kobayashi | H01L 27/14636 |
| 2018/0301443 A1* | 10/2018 | Kim | H01L 23/3121 |
| 2019/0057918 A1* | 2/2019 | Park | H01L 27/14636 |
| 2020/0286871 A1* | 9/2020 | Liff | G02B 6/125 |
| 2021/0104571 A1* | 4/2021 | Shohji | H01L 23/552 |

FOREIGN PATENT DOCUMENTS

| | | |
|---|---|---|
| JP | 2010135700 A | 6/2010 |
| JP | 2013175626 A | 9/2013 |
| JP | 2014-099582 A | 5/2014 |
| JP | 2017076872 A | 4/2017 |
| JP | 2017098903 A | 6/2017 |
| WO | 2015/159728 A1 | 10/2015 |
| WO | 2017/209221 A1 | 12/2017 |

* cited by examiner

[FIG. 1A]
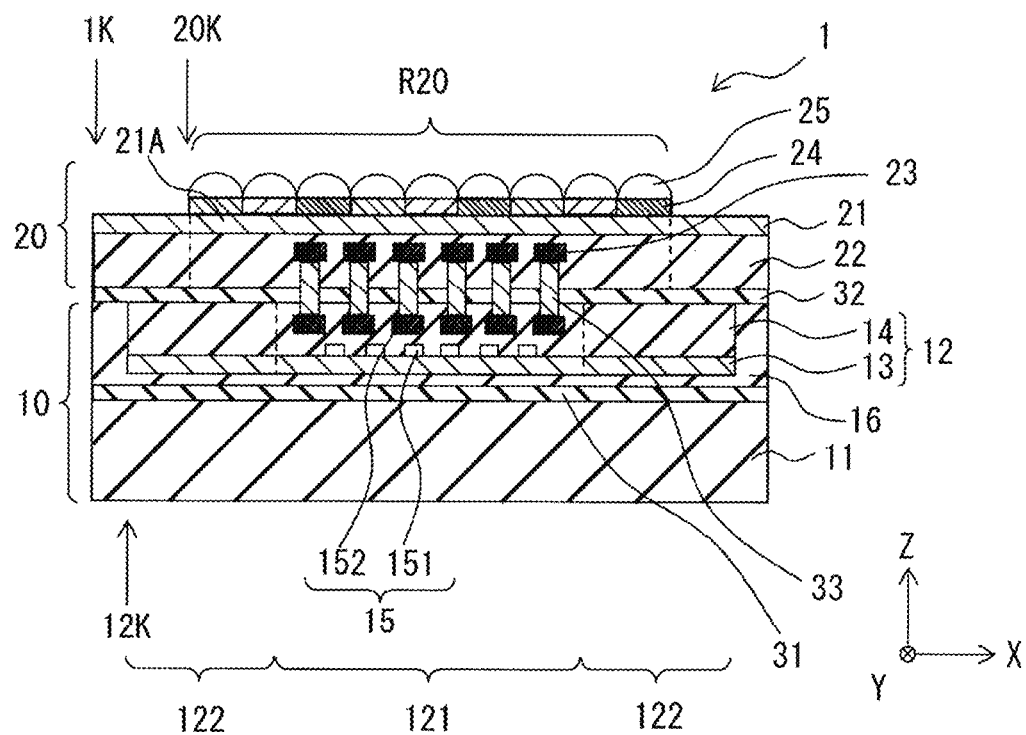
[FIG. 1B]
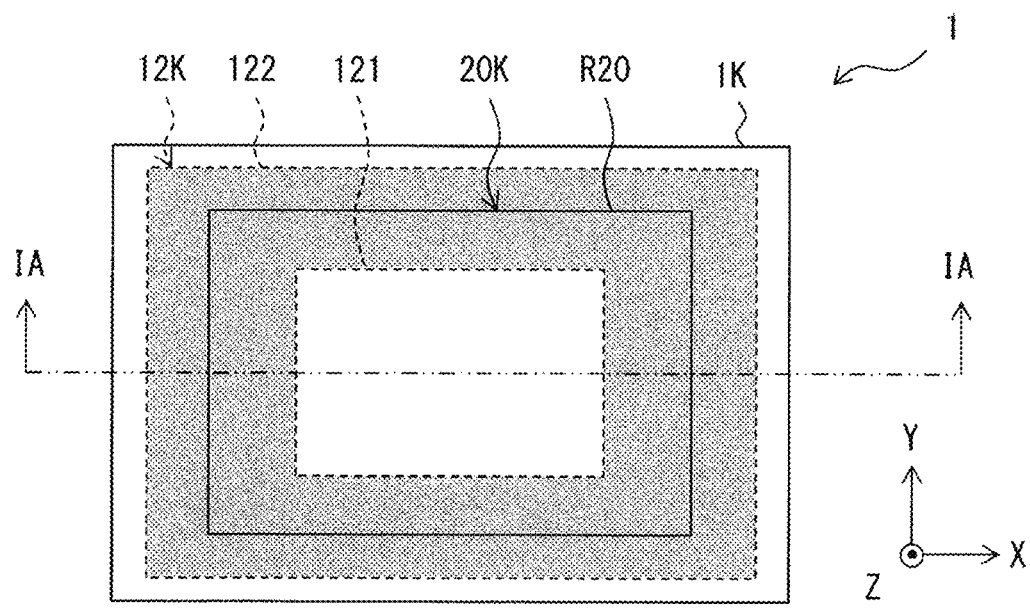

[FIG. 2A]
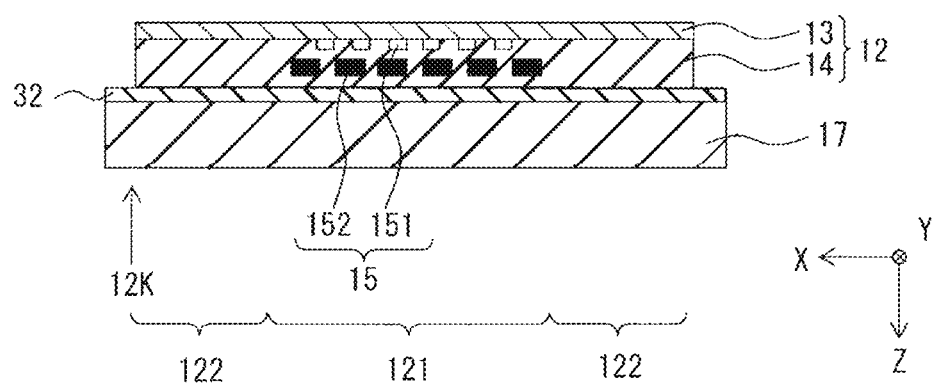
[FIG. 2B]
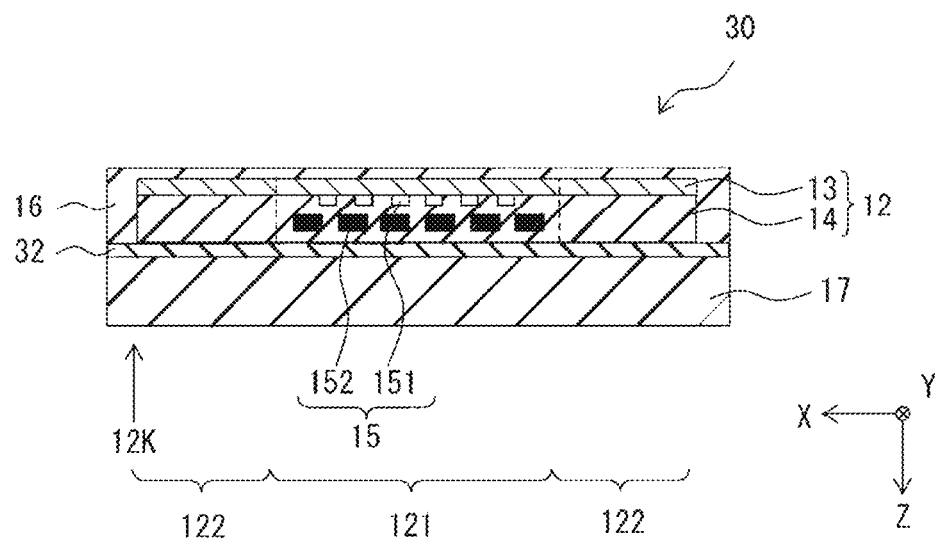

[FIG. 2C]
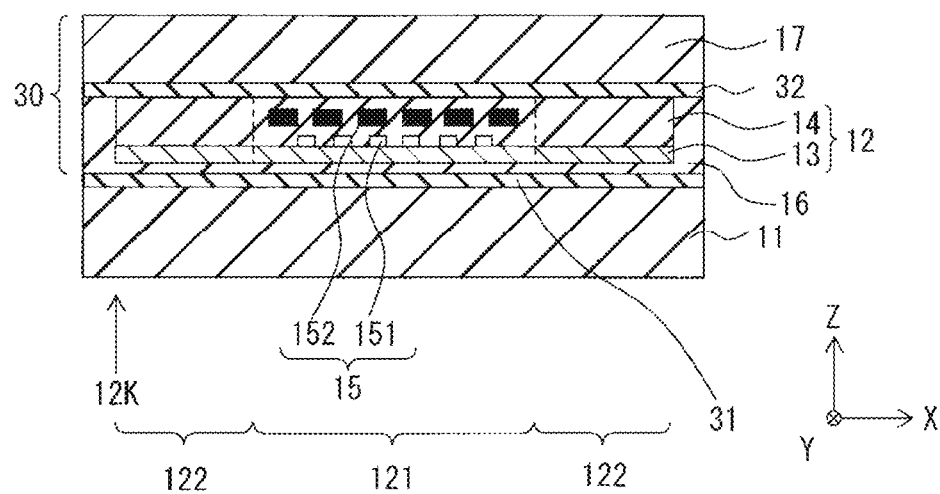
[FIG. 2D]
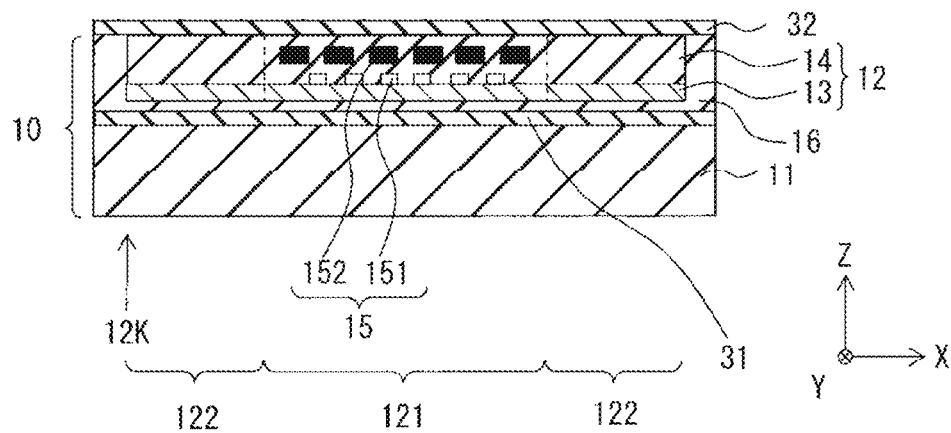

[FIG. 2E]
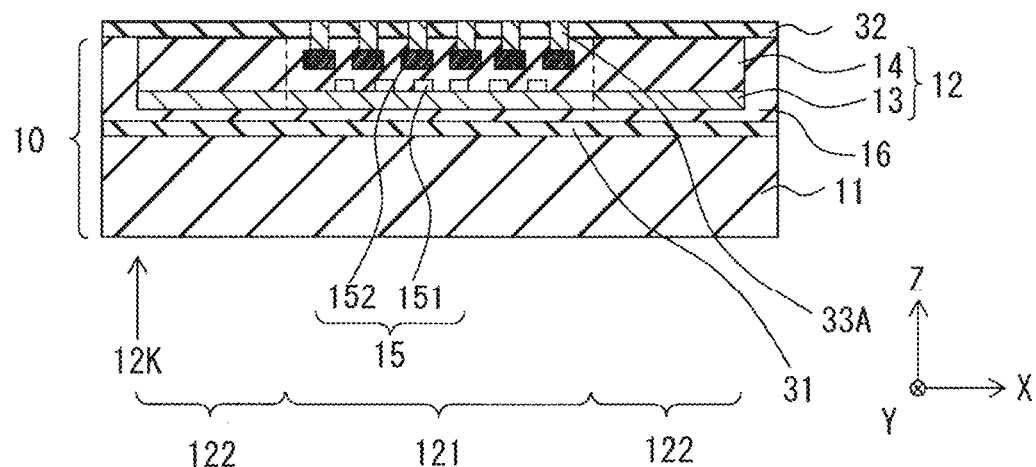
[FIG. 2F]
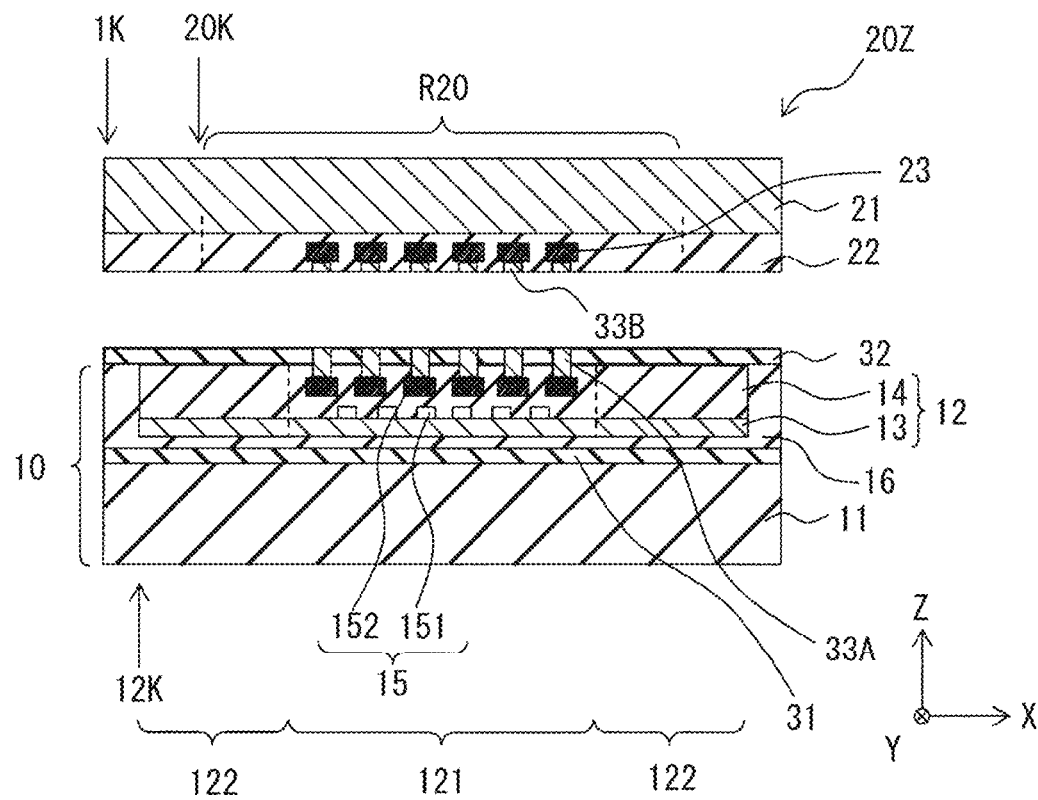

[FIG. 2G]
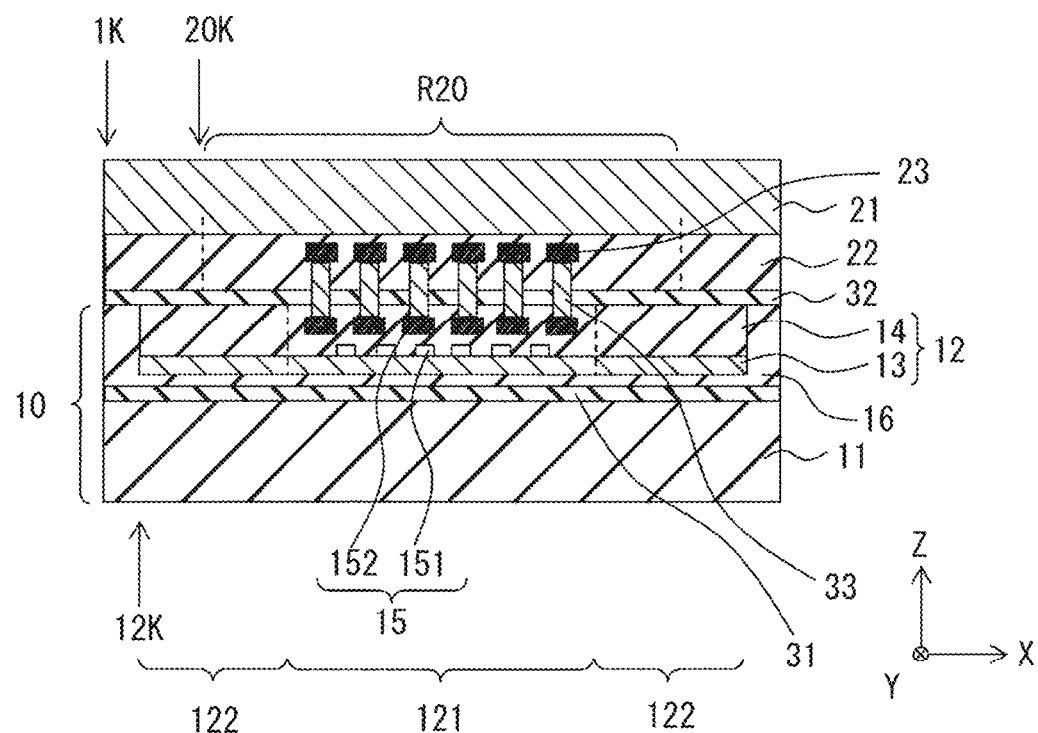
[FIG. 2H]
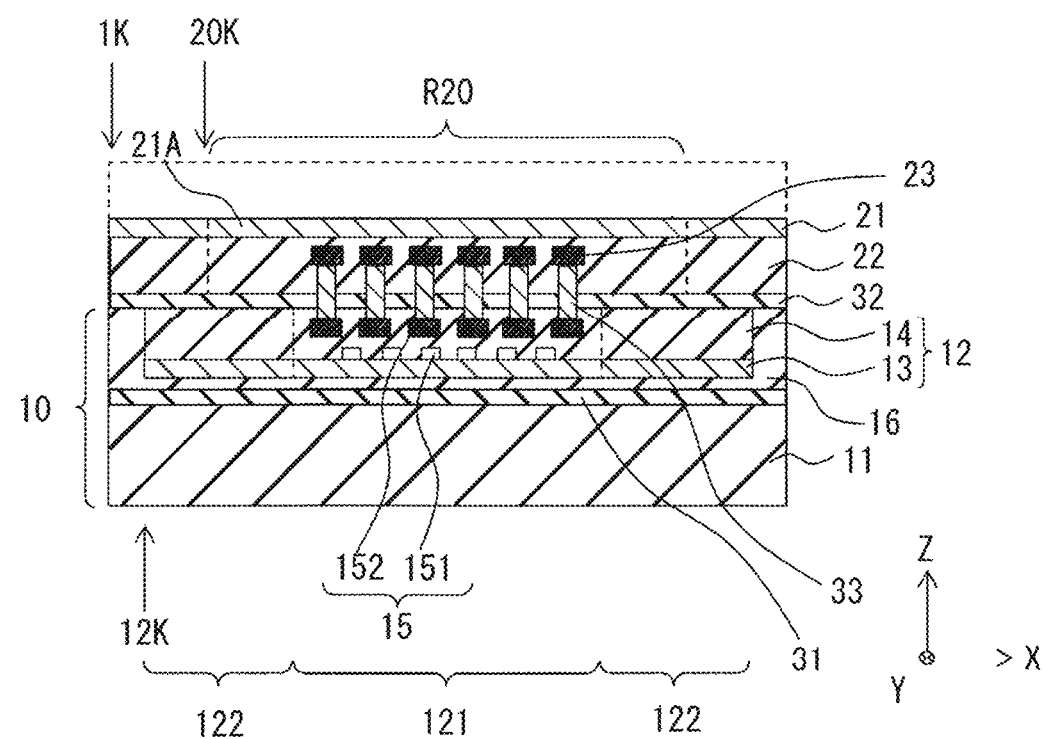

[FIG. 3A]
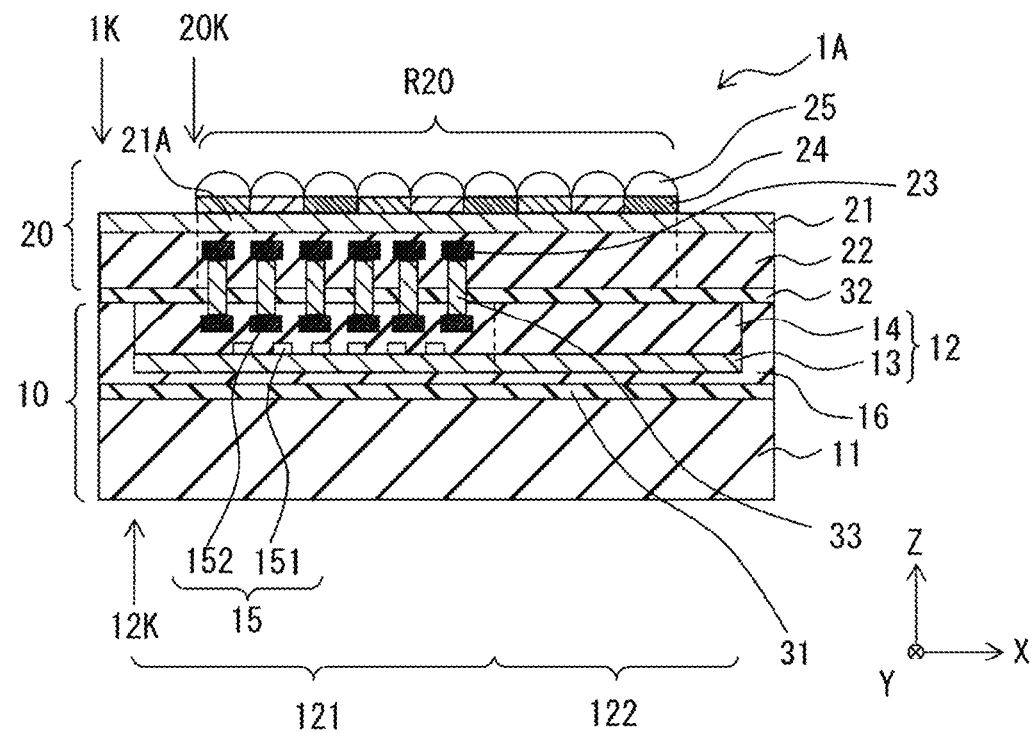
[FIG. 3B]
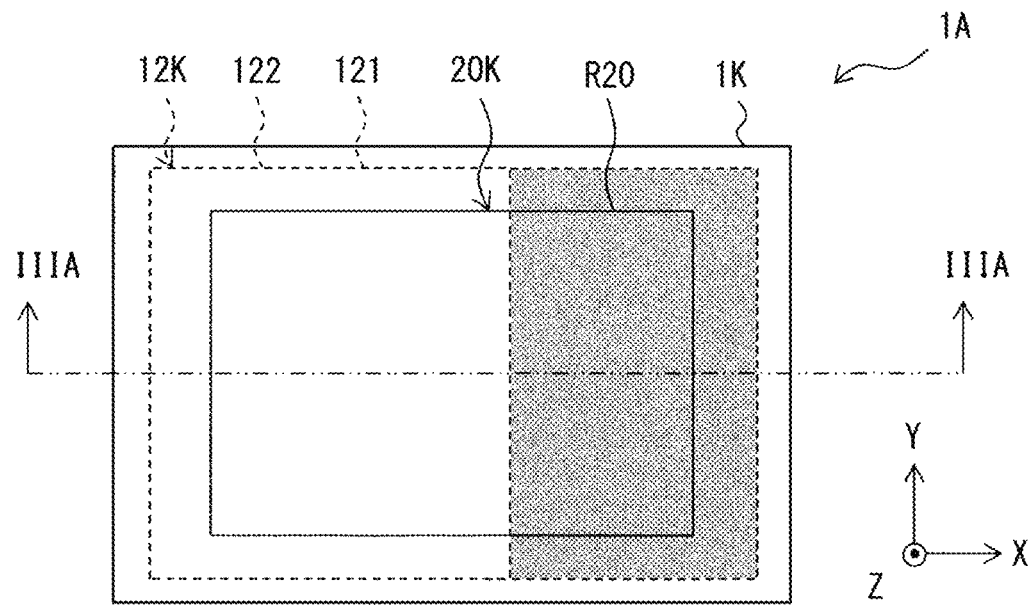

[FIG. 4]
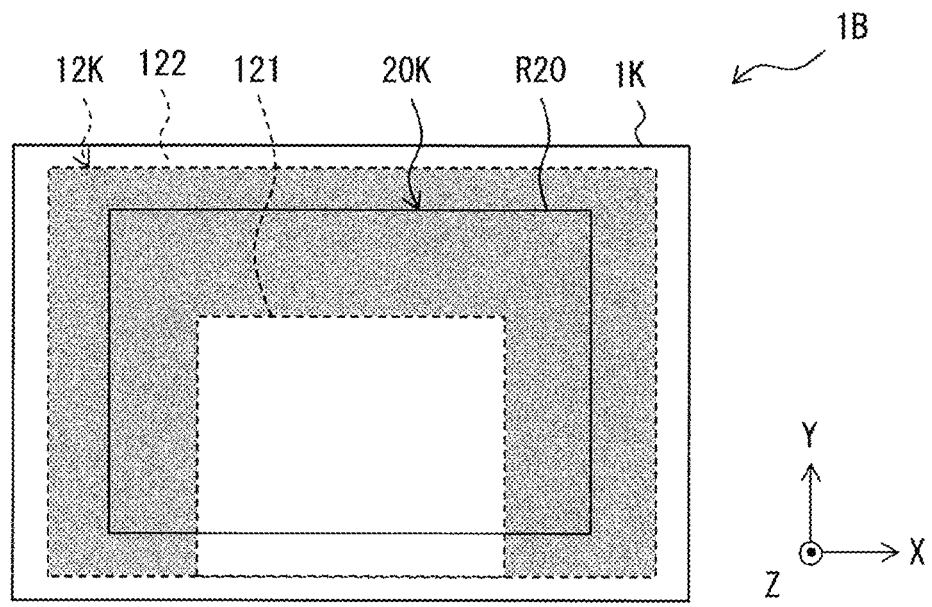
[FIG. 5]
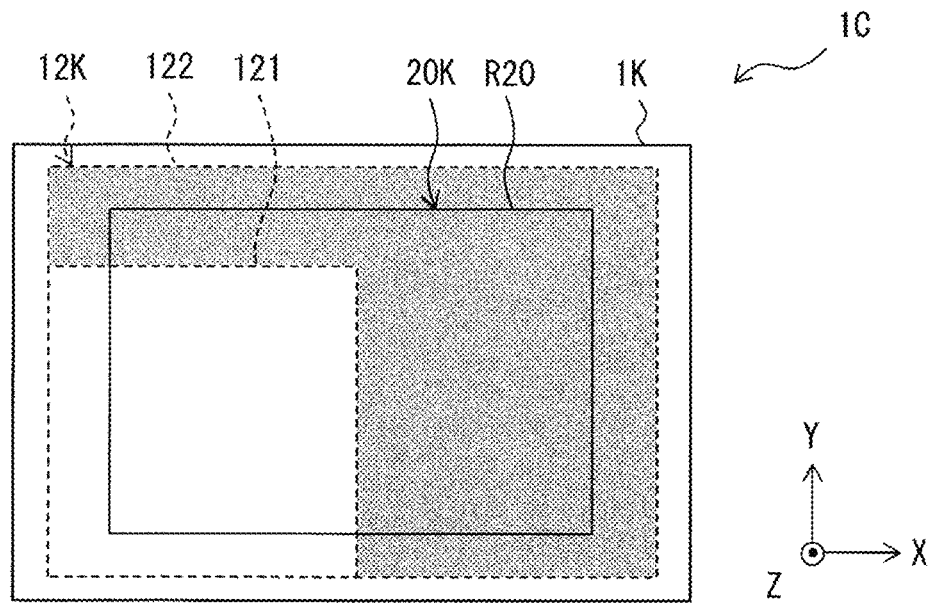

[FIG. 6A]
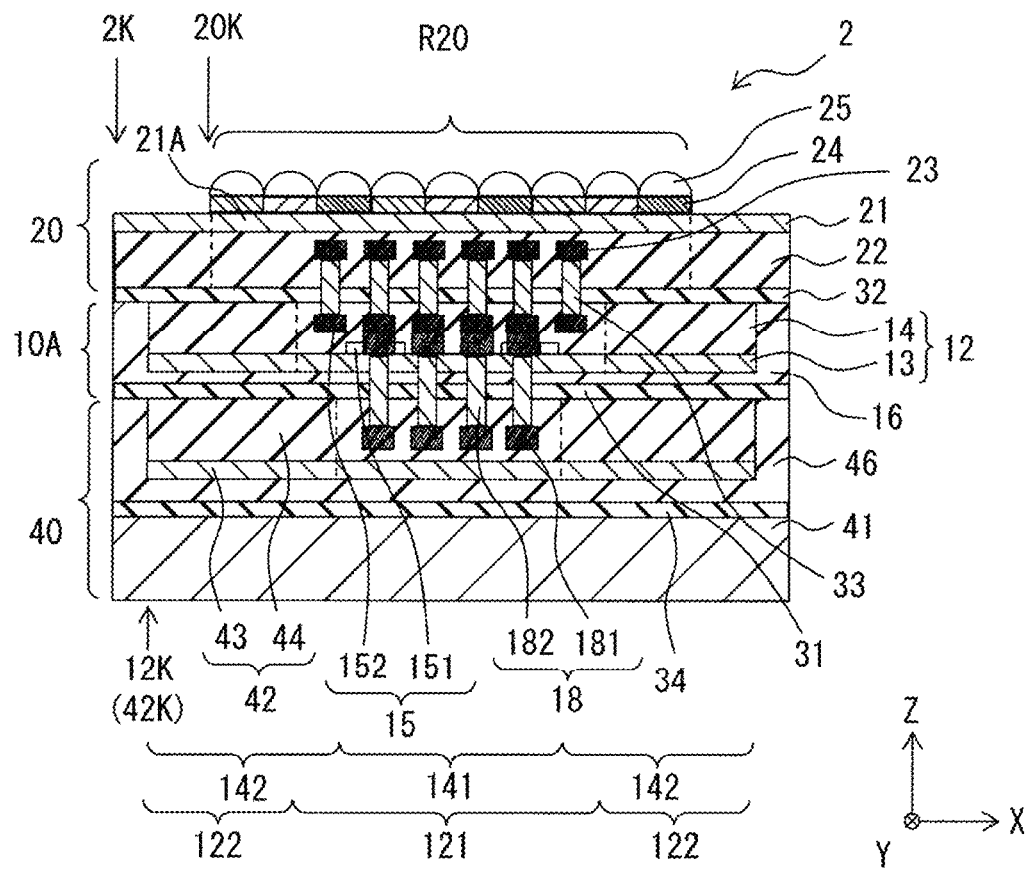
[FIG. 6B]
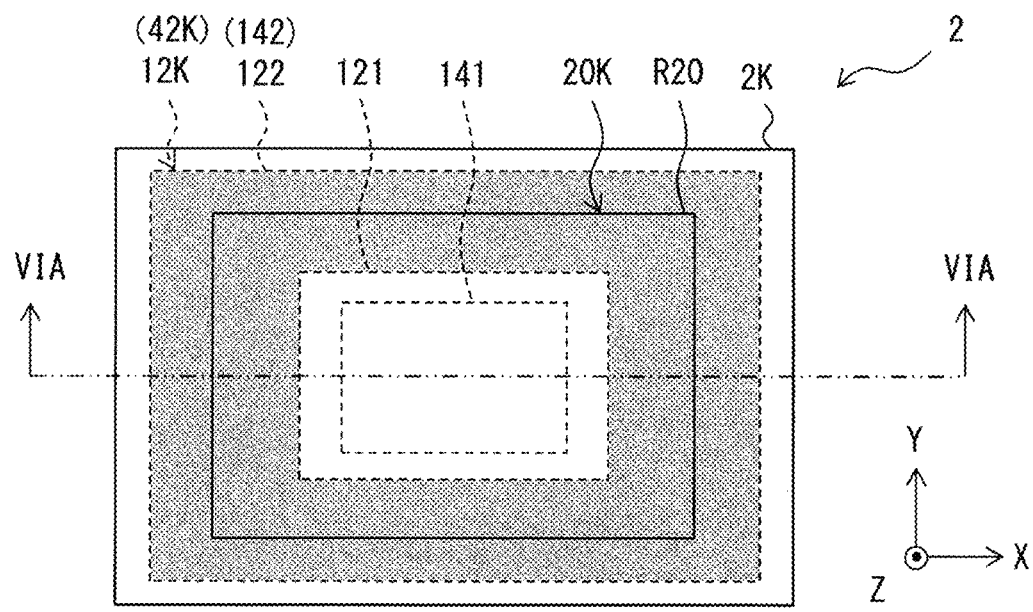

[FIG. 7]
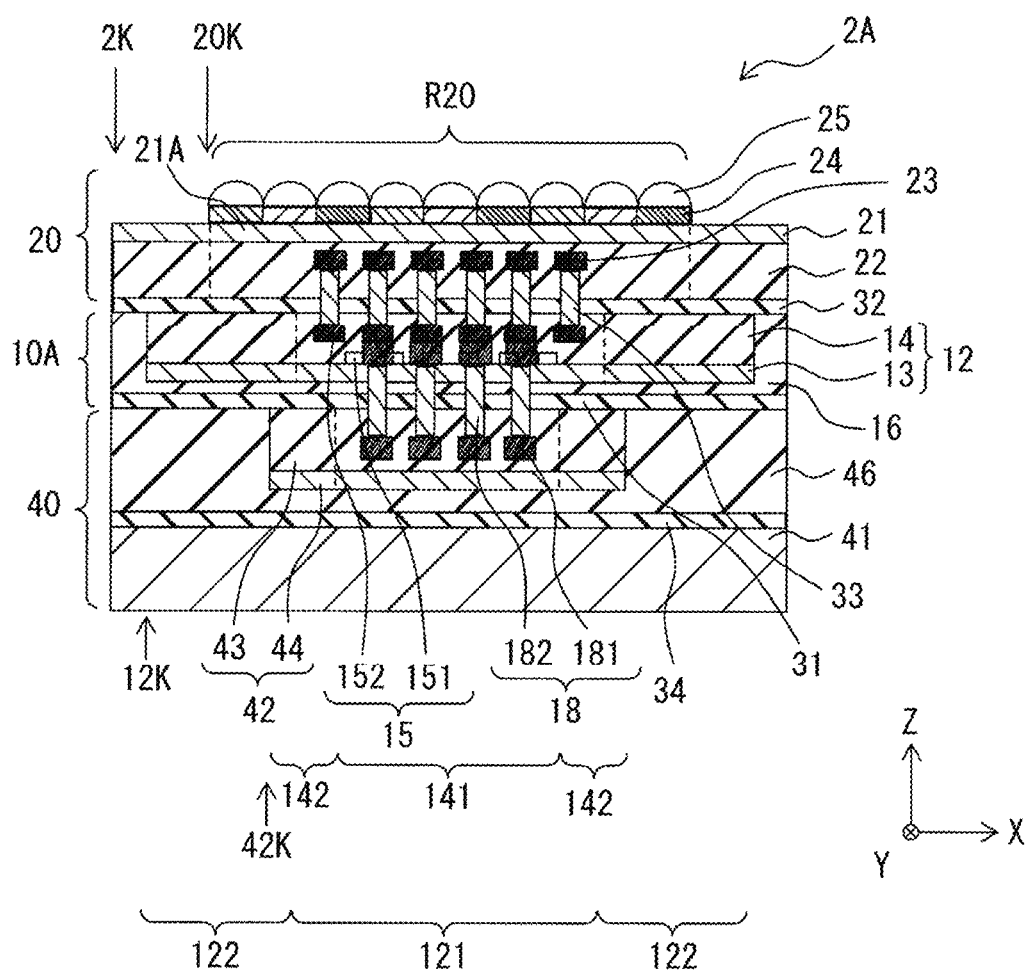

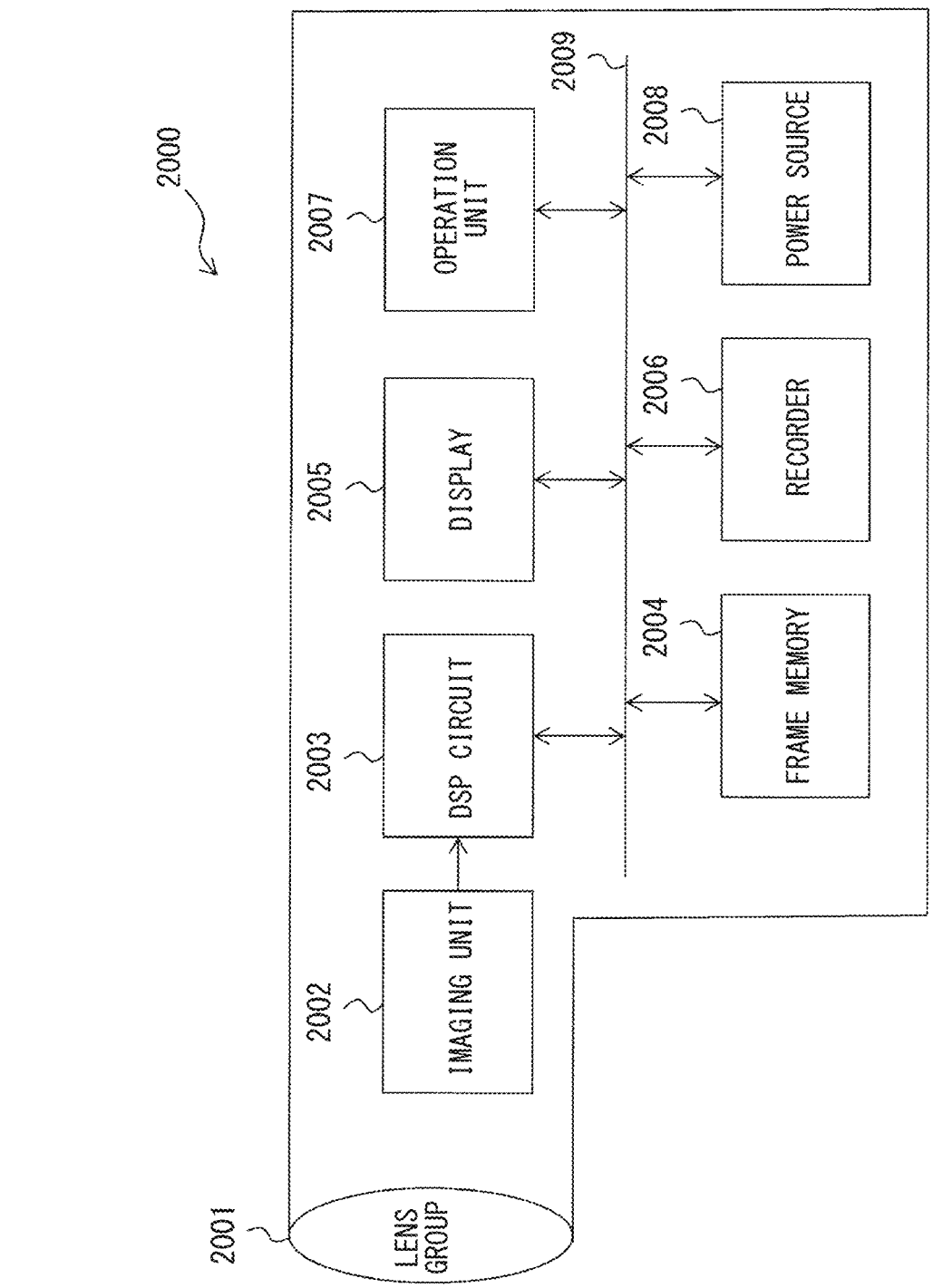
[FIG. 8]

[FIG. 9]
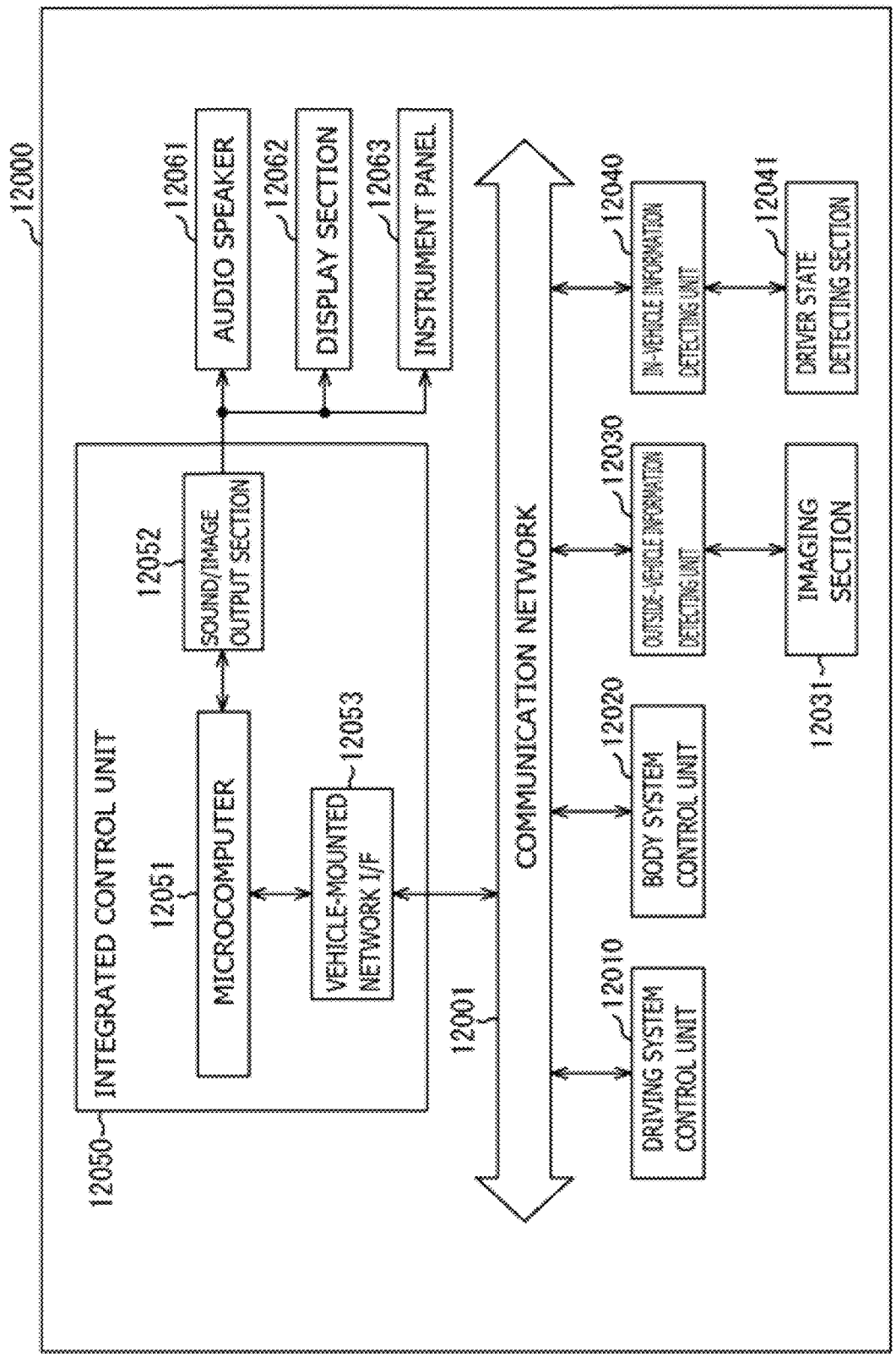

[FIG. 10]
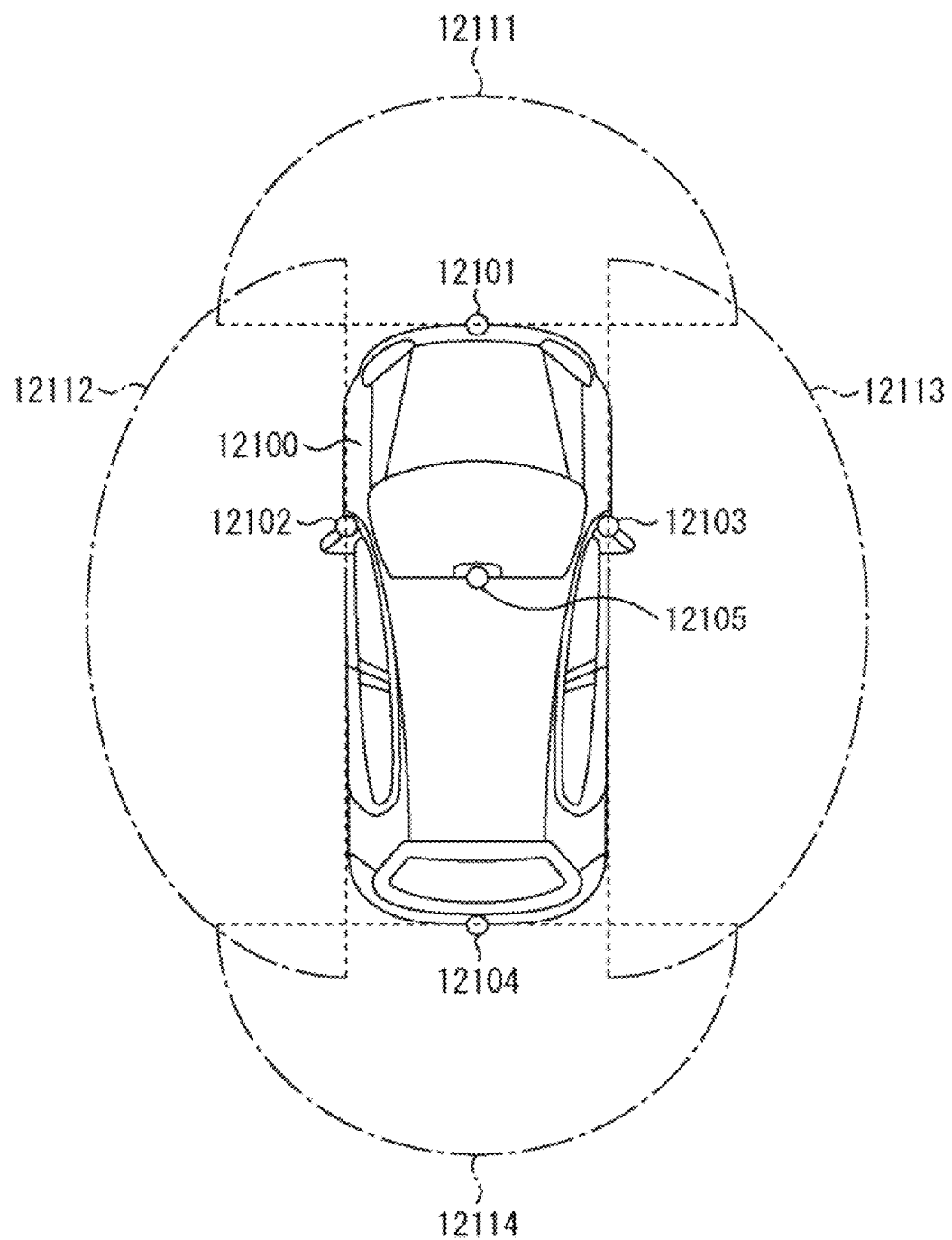

[FIG. 11]
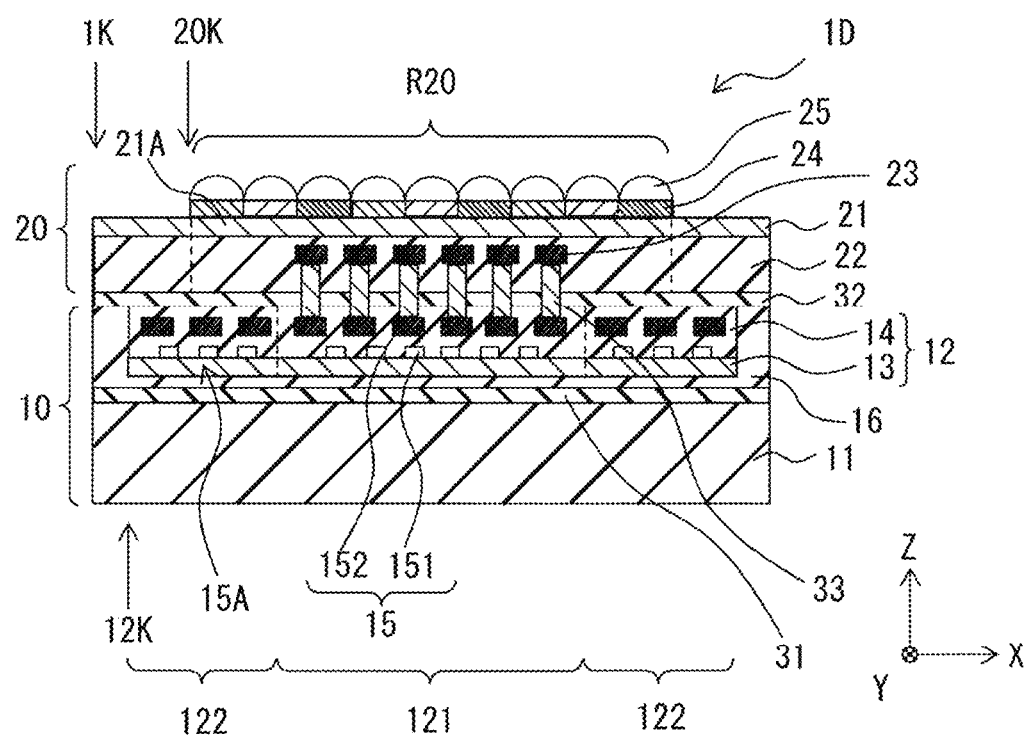

[FIG. 12]
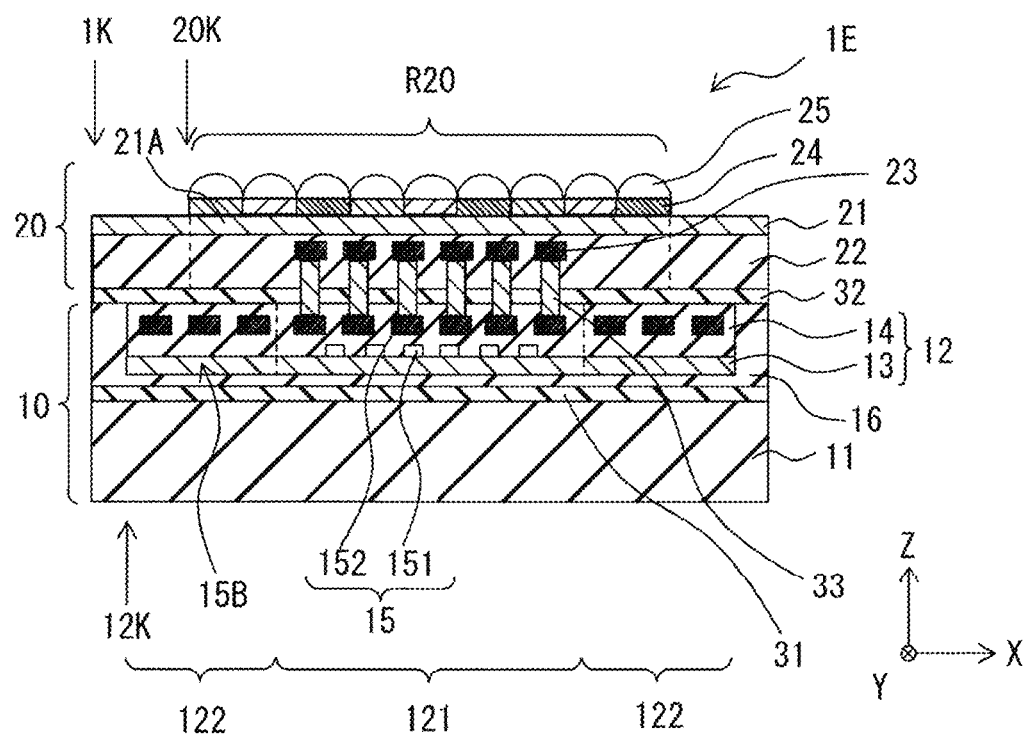

[FIG. 13A]
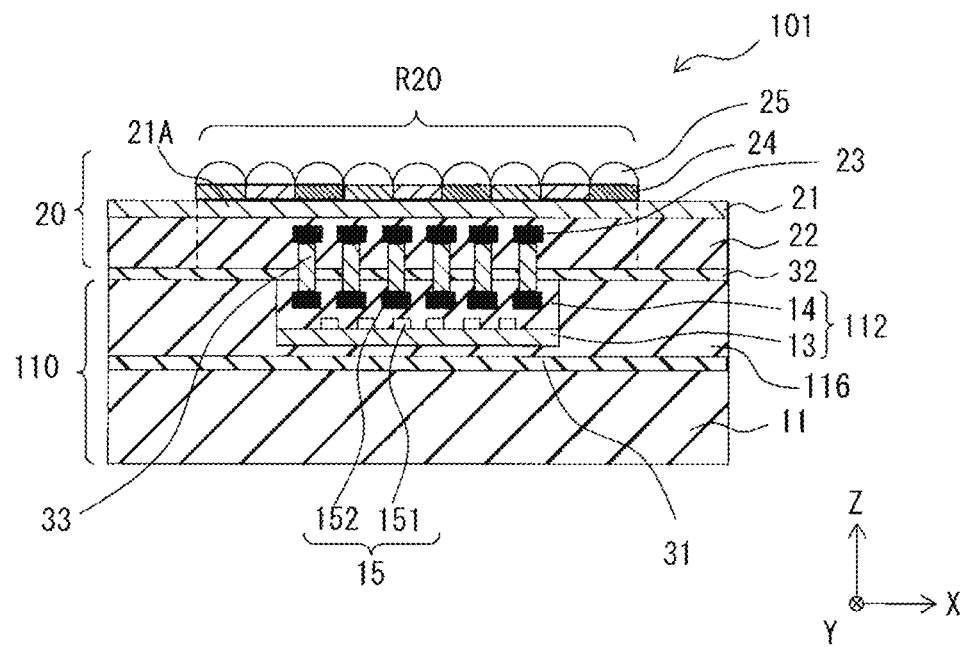
[FIG. 13B]
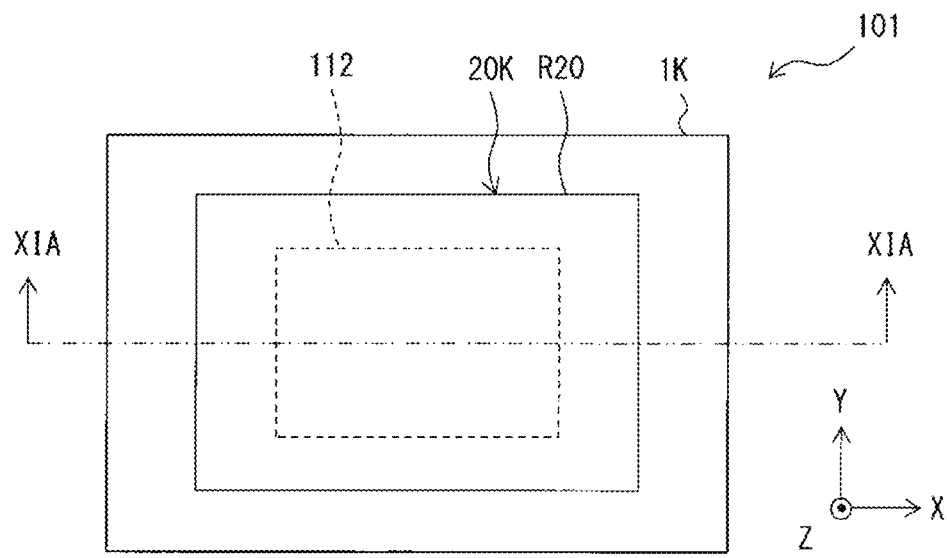

[FIG. 14A]
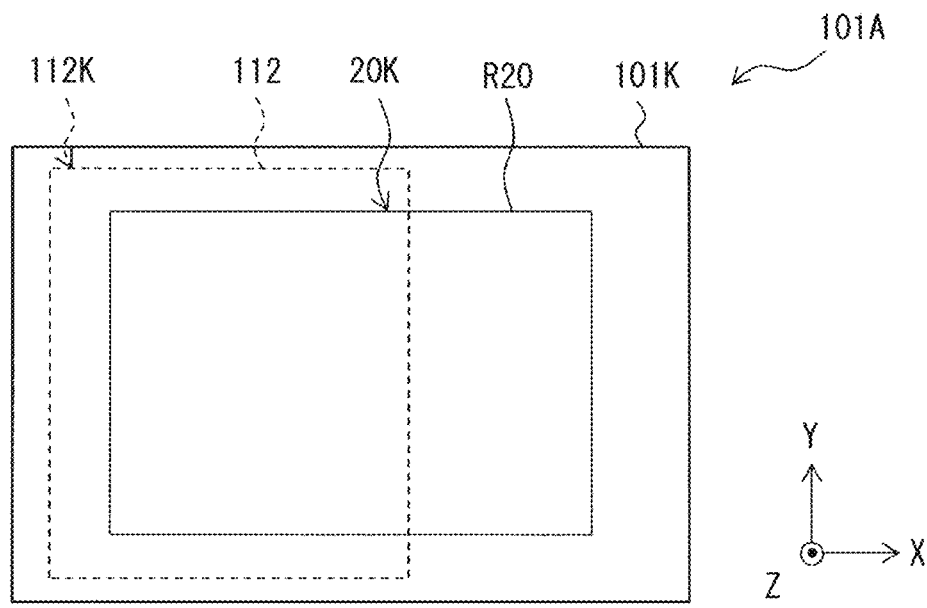
[FIG. 14B]
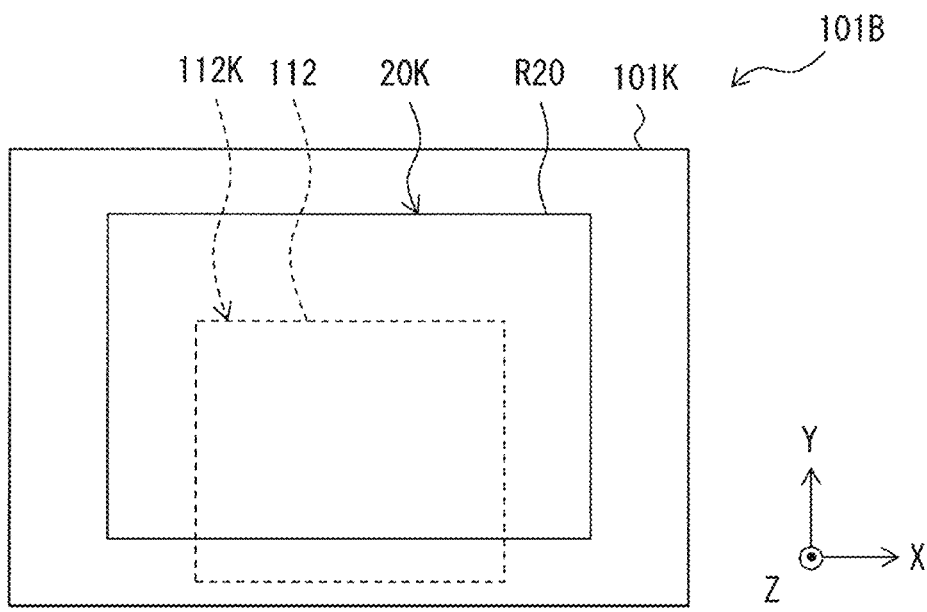

[FIG. 14C]
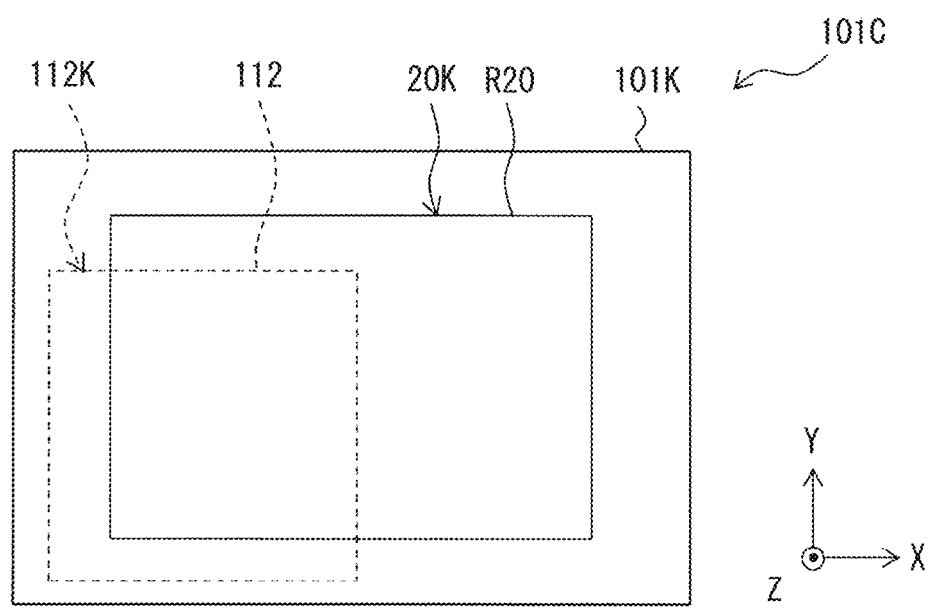

IMAGING UNIT HAVING A STACKED STRUCTURE AND ELECTRONIC APPARATUS INCLUDING THE IMAGING UNIT

CROSS REFERENCE TO RELATED APPLICATIONS

This application is a U.S. National Phase of International Patent Application No. PCT/JP2019/003160 filed on Jan. 30, 2019, which claims priority benefit of Japanese Patent Application No. JP 2018-051318 filed in the Japan Patent Office on Mar. 19, 2018. Each of the above-referenced applications is hereby incorporated herein by reference in its entirety.

TECHNICAL FIELD

The present disclosure relates to: an imaging unit including an imaging device; and an electronic apparatus including the imaging unit.

BACKGROUND ART

To achieve size reduction of an imaging unit, there has been proposed a WoW (Wafer on Wafer) stacking technique that bonds: a wafer including an imaging device that generates a pixel signal; and a wafer including a signal processing circuit that performs signal processing on the pixel signal generated by the imaging device, a memory circuit, etc. to each other (for example, PTL 1).

CITATION LIST

Patent Literature

PTL 1: Japanese Unexamined Patent Application Publication No. 2014-099582

SUMMARY OF THE INVENTION

Meanwhile, it is desired that such an imaging unit has an excellent imaging performance.

Accordingly, it is desirable to provide: an imaging unit that is able to be manufactured more efficiently while being highly accurate in dimensions; and an electronic apparatus that includes the imaging unit.

An imaging unit according to an embodiment of the present disclosure includes a stacked structure that includes a sensor board and a circuit board. The sensor board has an effective pixel region where an imaging device is disposed. The imaging device includes a plurality of pixels and is configured to receive external light in each of the pixels to generate a pixel signal. The circuit board includes a chip. The chip includes a first portion and a second portion that are integrated with each other. The first portion includes a signal processing circuit that performs signal processing of the pixel signal. The second portion is disposed at a position different from a position of the first portion in an in-plane direction. Here, both the first portion and the second portion are positioned to overlap the effective pixel region in a stacking direction of the sensor board and the circuit board.

An electronic apparatus according to an embodiment of the present disclosure includes the above-described imaging unit.

According to the imaging unit and the electronic apparatus of the embodiments of the present disclosure, warpage, deformation, or the like of the imaging unit as a whole is allowed to be suppressed with a simple configuration. Therefore, it is possible to achieve more efficient manufacturing while securing high dimensional accuracy.

It is to be noted that effects of the present disclosure are not limited to the above and may include any of effects described below.

BRIEF DESCRIPTION OF THE DRAWING

FIG. 1A is a cross-sectional view of an overall configuration example of a solid-state imaging unit according to a first embodiment of the present disclosure.

FIG. 1B is a plan view of a configuration of a solid-state imaging unit illustrated in FIG. 1A.

FIG. 2A is a cross-sectional view of one process of a method of manufacturing the solid-state imaging unit illustrated in FIG. 1A.

FIG. 2B is a cross-sectional view of one process subsequent to that in FIG. 2A.

FIG. 2C is a cross-sectional view of one process subsequent to that in FIG. 2B.

FIG. 2D is a cross-sectional view of one process subsequent to that in FIG. 2C.

FIG. 2E is a cross-sectional view of one process subsequent to that in FIG. 2D.

FIG. 2F is a cross-sectional view of one process subsequent to that in FIG. 2E.

FIG. 2G is a cross-sectional view of one process subsequent to that in FIG. 2F.

FIG. 2H is a cross-sectional view of one process subsequent to that in FIG. 2G.

FIG. 3A is a cross-sectional view of an overall configuration example of a solid-state imaging unit according to a first modification example of the present disclosure.

FIG. 3B is a plan view of a configuration of a solid-state imaging unit illustrated in FIG. 3A.

FIG. 4 is a plan view of an overall configuration example of a solid-state imaging unit according to a second modification example of the present disclosure.

FIG. 5 is a plan view of an overall configuration example of a solid-state imaging unit according to a third modification example of the present disclosure.

FIG. 6A is a cross-sectional view of an overall configuration example of a solid-state imaging unit according to a second embodiment of the present disclosure.

FIG. 6B is a plan view of a configuration of a solid-state imaging unit illustrated in FIG. 6A.

FIG. 7 is a cross-sectional view of an overall configuration example of a solid-state imaging unit according to a fourth modification example of the present disclosure.

FIG. 8 is a schematic diagram illustrating an overall configuration example of an electronic apparatus according to a third embodiment of the present disclosure.

FIG. 9 is a block diagram depicting an example of schematic configuration of a vehicle control system.

FIG. 10 is a diagram of assistance in explaining an example of installation positions of an outside-vehicle information detecting section and an imaging section.

FIG. 11 is a plan view of an overall configuration example of a solid-state imaging unit according to a fifth modification example of the present disclosure.

FIG. 12 is a plan view of an overall configuration example of a solid-state imaging unit according to a sixth modification example of the present disclosure.

FIG. 13A is a cross-sectional view of an overall configuration example of a solid-state imaging unit according to a first reference example.

FIG. 13B is a plan view of an overall configuration example of the solid-state imaging unit according to the first reference example.

FIG. 14A is a plan view of an overall configuration example of a solid-state imaging unit according to a second reference example.

FIG. 14B is a plan view of an overall configuration example of a solid-state imaging unit according to a third reference example.

FIG. 14C is a plan view of an overall configuration example of a solid-state imaging unit according to a fourth reference example.

MODES FOR CARRYING OUT THE INVENTION

In the following, some embodiments of the present disclosure are described in detail with reference to the drawings. It is to be noted that the description is given in the following order.
1. First Embodiment (An example of a solid-state imaging unit with a two-layer structure)
2. Modification Examples of First Embodiment
3. Second Embodiment (An example of a solid-state imaging unit with a three-layer structure)
4. Third Embodiment (An example of an application to an electronic apparatus)
5. Example of Application to Mobile Body
6. Other Modification Examples

1. First Embodiment

[Configuration of Solid-state Imaging Unit 1]

FIGS. 1A and 1B each schematically illustrate an overall configuration example of a solid-state imaging unit 1 according to a first embodiment of the present disclosure. FIG. 1A illustrates a cross-sectional configuration of the solid-state imaging unit 1 and FIG. 1B illustrates a planar configuration of the solid-state imaging unit 1. FIG. 1A corresponds to a cross-sectional view in an arrow direction taken along a section line IA-IA illustrated in FIG. 1B.

The solid-state imaging unit 1 has a two-layer structure including a circuit board 10 and a sensor board 20. In the present embodiment, a stacking direction of the circuit board 10 and the sensor board 20 is defined as a Z-axis direction and a plane where the circuit board 10 and the sensor board 20 extend is defined as an XY-plane. As illustrated in FIGS. 1A and 1B, a reference sign 1K denotes an outer edge of the solid-state imaging unit 1. The outer edge 1K of the solid-state imaging unit 1 coincides with an outermost edge of the circuit board 10 and an outermost edge of the sensor board 20.

The circuit board 10 includes a support substrate 11 and a logic chip 12 disposed on the support substrate 11. Surroundings of the logic chip 12 are filled with an insulating layer 16. The insulating layer 16 is formed, for example, of an inorganic oxide such as silicon oxide (SiOx) or silicon nitride (SiNx). The support substrate 11 and the insulating layer 16 are bonded to each other, for example, by means of an oxide film bonding layer 31. The logic chip 12 includes an effective portion 121 and a dummy portion 122 that are integrated with each other. The dummy portion 122 is provided at a position different from a position of the effective portion 121 in an in-plane direction. The dummy portion 122 is so disposed, for example, as to fully surround the effective portion 121. The effective portion 121 includes a signal processing circuit that performs signal processing of a pixel signal from a solid-state imaging device 21A. FIG. 1A and FIG. 1B each illustrate a logic circuit 15 as an example of the signal processing circuit. Moreover, the logic chip 12 has a structure where a circuit formation layer 14 is disposed on a substrate 13 such as a semiconductor substrate in the stacking direction (the Z-axis direction). The logic circuit 15 is disposed in the circuit formation layer 14. The logic circuit 15 includes, for example: a semiconductor device 151 such as a transistor; and a wiring line 152.

The sensor board 20 has a structure where a wiring layer 22 is stacked on a device formation layer 21 that includes the solid-state imaging device 21A. The sensor board 20 has an effective pixel region R20 where the solid-state imaging device 21A is disposed within the XY-plane. The effective pixel region R20 refers to, for example, a region on inner side of a light shielding region (OPB), i.e., a region that is configured to receive external light. The solid-state imaging device 21A includes a plurality of pixels and is configured to receive the external light on a pixel-unit basis to generate a pixel signal. The pixels may each include a photodiode or the like. The wiring layer 22 is provided with a terminal 23 adapted, for example, to electrically couple the solid-state imaging device 21A and the wiring line 152 of the logic circuit 15 of the sensor board 20 to each other. The sensor board 20 further includes a plurality of color filters 24 and a plurality of on-chip lenses 25 both stacked on the device formation layer 21. The sensor board 20 and the circuit board 10 are bonded to each other, for example, by means of an oxide film bonding layer 32. The terminal 23 is coupled to the wiring line 152 via a contact plug 33 extending in the Z-axis direction. The contact plug 33 electrically couples the solid-state imaging device 21A and the logic circuit 15 to each other. The contact plug 33 penetrates the wiring layer 22, the oxide film bonding layer 32, and the circuit formation layer 14.

Both the effective portion 121 and the dummy portion 122 of the logic chip 12 are so positioned as to overlap the effective pixel region R20 in the stacking direction (the Z-axis direction) of the sensor board 20 and the circuit board 10. It should be noted that a part of the dummy portion 122 is so positioned as to overlap the effective pixel region R20 in the Z-axis direction, while another part of the dummy portion 122 is so positioned as to extend to outside of the effective pixel region R20 in the Z-axis direction. That is, as illustrated in FIG. 1B, a boundary between the effective portion 121 and the dummy portion 122 within the XY-plane, i.e., an outer edge of the effective portion, is positioned on inner side of an outer edge 20K of the effective pixel region R20. Meanwhile, an outer edge of the dummy portion 122, i.e., an outer edge 12K of the logic chip 12, is positioned on outer side of the outer edge 20K of the effective pixel region R20.

The outer edge 12K of the logic chip 12 is positioned on the outer side with respect to the outer edge 20K of the effective pixel region R20 in the stacking direction (the Z-axis direction) of the sensor board 20 and the circuit board 10.

[Method of Manufacturing Solid-State Imaging Unit 1]

Next, a description is given of a method of manufacturing the solid-state imaging unit 1, with reference to FIGS. 2A, 2B, 2C, 2D, 2E, 2F, 2G, and 2H. Each of FIGS. 2A, 2B, 2C, 2D, 2E, 2F, 2G, and 2H is a cross-sectional view of one process of the method of manufacturing the solid-state imaging unit 1, corresponding to FIG. 1A.

First, as illustrated in FIG. 2A, a support substrate 17 and the logic chip 12 are individually prepared, following which the logic chip 12 is bonded to the support substrate 17 by, for example, oxide film bonding. The oxide film bonding layer 32 is formed in an interface between the support substrate 17 and the logic chip 12.

Thereafter, as illustrated in FIG. 2B, the insulating layer 16 is formed to embed the logic chip 12 on the support substrate 17 by, for example, a gas phase method. After the formation of the insulating layer 16, a surface of the insulating layer 16 is flattened. A structure 30 is thereby obtained.

Thereafter, as illustrated in FIG. 2C, the structure 30 is inverted upside down and the flattened surface of the insulating layer 16 is bonded to the separately-prepared support substrate 11 by, for example, oxide film bonding. The oxide film bonding layer 31 is formed in an interface between the support substrate 11 and the insulating layer 16.

Thereafter, as illustrated in FIG. 2D, the support substrate 17 is removed by peeling, etching, or the like. The circuit board 10 thereby comes out.

Thereafter, as illustrated in FIG. 2E, a contact plug 33A is formed. The contact plug 33A is adapted to electrically couple the solid-state imaging device 21A of the sensor board 20 and the wiring line 152 of the circuit board 10 to each other. One end of the contact plug 33A is coupled to the wiring line 152 and the other end of the contact plug 33A is exposed on a surface of the oxide film bonding layer 32.

Thereafter, as illustrated in FIG. 2F, a structure 20Z is prepared. The structure 20Z includes the device formation layer 21 and the wiring layer 22 stacked on the device formation layer 21. The device formation layer 21 includes the solid-state imaging device 21A. Embedded in the wiring layer 22 is the terminal 23. Further, the wiring layer 22 is provided with a contact plug 33B having one end coupled to the terminal 23. The other end of the contact plug 33B is exposed on a surface of the wiring layer 22. Here, the structure 20Z and the circuit board 10 are aligned with each other within the XY-plane in a state where the surface of the wiring layer 22 of the structure 20Z and the oxide film bonding layer 32 of the circuit board 10 are opposed to each other.

After the alignment of the structure 20Z and the circuit board 10 with each other within the XY-plane, as illustrated in FIG. 2G, the structure 20Z and the circuit board 10 are adhered to each other. Here, the other end of the contact plug 33A disposed in the circuit board 10 and the other end of the contact plug 33B disposed in the structure 20Z are, for example, Cu—Cu-bonded, thereby forming the contact plug 33.

Thereafter, as illustrated in FIG. 2H, the device formation layer 21 of the structure 20Z is thinned. Lastly, the plurality of color filters 24 and the plurality of on-chip lenses 25 are stacked on the thinned device formation layer 21, thereby forming the sensor board 20 (see FIG. 1A). The solid-state imaging unit 1 is thereby completed.

[Workings and Effects of Solid-State Imaging Unit 1]

As described above, in the solid-state imaging unit 1 according to the present embodiment, the effective portion 121 and the dummy portion 122 of the logic chip 12 of the circuit board 10 are both so positioned as to overlap the effective pixel region R20 of the sensor board 20 in the stacking direction. Typically, an area occupied by the effective portion 121, in which the logic circuit 15 is disposed, within the XY-plane is often smaller than an area occupied by the effective pixel region R20 within the XY-plane. For this reason, in a case of a solid-state imaging unit 101 according to a first reference example illustrated in FIG. 13A and FIG. 13B, warpage, deformation, or the like of the solid-state imaging unit 101 as a whole tends to be greater due to a difference between a coefficient of thermal expansion of an insulating layer 116 and a coefficient of thermal expansion of the sensor board 20. The solid-state imaging unit 101 has a structure where a logic chip 112, which occupies a smaller area than the sensor board 20, is disposed only at a position overlapping part of the effective pixel region R20 and surroundings of the logic chip 112 are filled with the insulating layer 116. The logic chip 112 includes only a portion corresponding to the effective portion 121 of the logic chip 12 of the solid-state imaging unit 1. Except for the above, the solid-state imaging unit 101 is substantially the same in the rest of the configuration as the solid-state imaging unit 1. It is to be noted that a reference sign 101K denotes an outer edge of the solid-state imaging unit 101 in FIG. 13A and FIG. 13B.

In this regard, according to the solid-state imaging unit 1, the region overlapping the effective pixel region R20 is occupied by the effective portion 121 and the dummy portion 122. Accordingly, it is allowed to reduce warpage, deformation, or the like of the solid-state imaging unit 1 as a whole. A reason for this is that a volume of the insulating layer 16 filling the surroundings of the logic chip 12 in the circuit board 10 is reduced, and an influence of expansion and contraction of the insulating layer 16 is thereby reduced. Therefore, the solid-state imaging unit 1 according to the present embodiment ensures high dimensional accuracy and is allowed to take in a favorable image.

Moreover, in the solid-state imaging unit 1, only the single logic chip 12 is disposed in the circuit board 10, and the circuit board 10 and the sensor board 20 are bonded to each other. For this reason, the alignment operation only has to be performed once. Therefore, as compared with a case of adhering two or more circuit boards arranged side by side within the XY-plane to a sensor board, this contributes to an improvement in positional accuracy and an improvement in operation efficiency at the time of manufacturing.

Moreover, in the solid-state imaging unit 1, the outer edge 12K of the logic chip 12 is positioned on the outer side with respect to the outer edge 20K of the effective pixel region R20 in the stacking direction (the Z-axis direction) of the sensor board 20 and the circuit board 10. For this reason, a positional relationship between the logic chip 12 and the effective pixel region R20 within the XY-plane is not a positional relationship where the outer edge 12K of the logic chip 12 extends across the effective pixel region R20. This reduces warpage, deformation, or the like of the solid-state imaging unit 1 as a whole due to a difference between the coefficient of thermal expansion of the circuit board 10 and the coefficient of thermal expansion of the sensor board 20, thus reducing a load of stress applied to the effective pixel region R20. As a result, it is possible to effectively reduce the occurrence of a degraded image with a stripe pattern.

2. Modification Examples of First Embodiment

[Configuration of Solid-state Imaging Unit 1A]

FIG. 3A is a cross-sectional view of an overall configuration example of a solid-state imaging unit 1A according to a first modification example of the present disclosure (hereinafter referred to as Modification example 1), corresponding to FIG. 1A illustrating the solid-state imaging unit 1 according to the above-described first embodiment. Meanwhile, FIG. 3B is a plan view of a configuration of the solid-state imaging unit 1A, corresponding to FIG. 1B illustrating the solid-state imaging unit 1 according to the above-described first embodiment. It is to be noted that FIG. 3A corresponds to a cross-sectional view in an arrow direction taken along a section line IIIA-IIIA illustrated in FIG. 3B.

As illustrated in FIGS. 3A and 3B, in the solid-state imaging unit 1A according to Modification example 1, the effective portion 121 of the logic chip 12 is deviated to a left side (□X direction) in a plane of paper with respect to a middle of the logic chip 12. That is, in the solid-state imaging unit 1A according to Modification example 1, the dummy portion 122 of the logic chip 12 is positioned on a right side (□X direction) in the plane of paper with respect to the middle of the logic chip 12. It is to be noted that both the effective portion 121 and the dummy portion 122 in the solid-state imaging unit 1A according to Modification example 1 are so positioned as to overlap the effective pixel region R20 of the sensor board 20 in the stacking direction (Z-axis direction) as well.

[Configuration of Solid-State Imaging Unit 1B]

FIG. 4 is a plan view of an overall configuration example of a solid-state imaging unit 1B according to a second modification example of the present disclosure (hereinafter referred to as Modification example 2), corresponding to FIG. 1B illustrating the solid-state imaging unit 1 according to the above-described first embodiment.

As illustrated in FIG. 4, in the solid-state imaging unit 1B according to Modification example 2, the effective portion 121 of the logic chip 12 is deviated to lower side (−Y direction) in a plane of paper with respect to the middle of the logic chip 12. That is, in the solid-state imaging unit 1B according to Modification example 2, the dummy portion 122 of the logic chip 12 is so positioned as to occupy a region on right side of the effective portion 121, a region on upper side of the effective portion 121, and a region on left side of the effective portion 121. It is to be noted that both the effective portion 121 and the dummy portion 122 in the solid-state imaging unit 1B according to Modification example 2 are so positioned as to overlap the effective pixel region R20 of the sensor board 20 in the stacking direction (the Z-axis direction) as well.

[Configuration of Solid-state Imaging Unit 1C]

FIG. 5 is a plan view of an overall configuration example of a solid-state imaging unit 1C according to a third modification example of the present disclosure (hereinafter referred to as Modification example 3), corresponding to FIG. 1B illustrating the solid-state imaging unit 1 according to the above-described first embodiment.

As illustrated in FIG. 5, in the solid-state imaging unit 1C according to Modification example 3, the effective portion 121 of the logic chip 12 is deviated to lower-left side in a plane of paper with respect to the middle of the logic chip 12. That is, in the solid-state imaging unit 1C according to Modification example 3, the dummy portion 122 of the logic chip 12 is so positioned as to occupy a region on right side of the effective portion 121 and a region on upper side of the effective portion 121. It is to be noted that both the effective portion 121 and the dummy portion 122 in the solid-state imaging unit 1B according to Modification example 2 are so positioned as to overlap the effective pixel region R20 of the sensor board 20 in the stacking direction (the Z-axis direction) as well.

[Workings and Effects of Solid-state Imaging Units 1A to 1C]

As described above, in any of the solid-state imaging units 1A to 1C according to Modification examples 1 to 3, both the effective portion 121 and the dummy portion 122 are so positioned as to overlap the effective pixel region R20 of the sensor board 20 in the stacking direction (Z-axis direction). This reduces warpage, deformation, or the like of the solid-state imaging unit 1A as a whole due to a difference between the coefficient of thermal expansion of the insulating layer 16 of the circuit board 10 and the coefficient of thermal expansion of the sensor board 20. Therefore, each of the solid-state imaging units 1A to 1C ensures high dimensional accuracy and is allowed to take in a favorable image.

Moreover, in any of the solid-state imaging units 1A to 1C, the outer edge 12K of the logic chip 12 is positioned on the outer side with respect to the outer edge 20K of the effective pixel region R20 in the stacking direction (the Z-axis direction) of the sensor board 20 and the circuit board 10 as well. This reduces a load of stress applied to the effective pixel region R20 due to warpage, deformation, or the like of the solid-state imaging unit 1A as a whole. As a result, it is possible to effectively reduce the occurrence of a degraded image with a stripe pattern.

In contrast, for example, in any of solid-state imaging units 101A to 101C according to second to fourth reference examples illustrated in FIGS. 14A, 14B, and 14C, it is easier to noticeably cause warpage, deformation, or the like of the solid-state imaging units 101A to 101C as a whole due to a difference between a coefficient of thermal expansion of the insulating layer 116 of a circuit board 110 and a coefficient of thermal expansion of a sensor board 120. As with the solid-state imaging unit 101 illustrated in FIGS. 13A and 13B, the solid-state imaging units 101A to 101C respectively include logic chips 112A to 112C, each of which occupies a smaller area than the sensor board 20, only at a position overlapping part of the effective pixel region R20. Surroundings of each of the logic chips 112A to 112C are filled with the insulating layer 116. The logic chips 112A to 112C each have only a portion corresponding to the effective portion 121 of the logic chip 12 of the solid-state imaging unit 1. That is, in the solid-state imaging units 101A to 101C, the logic chips 112A to 112C have no dummy portion, and center positions of the respective logic chips 112A to 112C are deviated from a center position of the effective pixel region R20. Part of an outer edge 122K of each of the logic chips 112A to 112C thus extends across the effective pixel region R20. Such a configuration causes stress accompanying thermal expansion and thermal contraction of the insulating layer 116 to unevenly appear within the XY-plane. Therefore, it can be considered that it is easier to cause warpage, deformation, or the like of each of the solid-state imaging units 101A to 101C as a whole to occur. It is to be noted that the reference sign 101K in FIGS. 14A, 14B, and 14C denotes outer edges of the respective solid-state imaging units 101A to 101C.

In this regard, according to any of the solid-state imaging units 1A to 1C of Modification examples 1 to 3, a center position of the logic chip 12 substantially coincides with the center position of the effective pixel region R20, although a center position of the effective portion 121 is deviated from the center position of the effective pixel region R20. For this reason, the insulating layer 16 is highly symmetrically distributed within the XY-plane, making stress accompanying thermal expansion and thermal contraction of the insulating layer 16 to relatively uniformly appear within the XY-plane. Therefore, it can be considered that it is more difficult to cause warpage, deformation, or the like of each of the solid-state imaging units 1A to 1C as a whole to occur.

3. Second Embodiment

[Configuration of Solid-state Imaging Unit 2]

FIGS. 6A and 6B each schematically illustrate an overall configuration example of a solid-state imaging unit 2 according to a second embodiment of the present disclosure. FIG. 6A illustrates a cross-sectional configuration of the solid-state imaging unit 2, and FIG. 6B illustrates a planar configuration of the solid-state imaging unit 2. FIG. 6A corresponds to a cross-sectional diagram in an arrow direction taken along a section line VIA-VIA illustrated in FIG. 6B.

The solid-state imaging unit 2 has a three-layer structure including a circuit board 40, a circuit board 10A, and the sensor board 20. The circuit board 10A and the sensor board 20 have substantially the same configurations as those of the circuit board 10 and the sensor board 20 of the solid-state imaging unit 1 according to the above-described first embodiment, respectively. The circuit board 10A, however, includes no support substrate 11, and is bonded to the circuit board 40 by means of a lowermost layer of the circuit board 10A, namely, the oxide film bonding layer 31. In FIGS. 6A and 6B, a reference sign 2K denotes an outer edge of the solid-state imaging unit 2. The outer edge 2K of the solid-state imaging unit 2 coincides with an outermost edge of the circuit board 40, an outermost edge of the circuit board 10A, and the outermost edge of the sensor board 20.

The circuit board 40 includes a support substrate 41 and a memory chip 42 disposed on the support substrate 41. Surroundings of the memory chip 42 are filled with an insulating layer 46. The insulating layer 46 is formed of, for example, an inorganic oxide such as silicon oxide ($SiO_x$) or silicon nitride ($SiN_x$). The support substrate 41 and the insulating layer 46 are bonded to each other, for example, by means of an oxide film bonding layer 34. The memory chip 42 includes an effective portion 141 and a dummy portion 142 that are integrated with each other. The dummy portion 142 is disposed at a position different from a position of the effective portion 141 in an in-plane direction. The dummy portion 142 is so disposed as to fully surround the effective portion 141, for example. In the solid-state imaging unit 2, both the effective portion 141 and the dummy portion 142 of the memory chip 42 are so positioned as to overlap the effective pixel region R20 in the stacking direction (the Z-axis direction). The effective portion 141 is provided with a memory circuit 18. The memory circuit 18 configures part of a signal processing circuit that performs signal processing of a pixel signal from the solid-state imaging device 21A. Moreover, the memory chip 42 has a structure where a circuit formation layer 44 is disposed on a substrate 43 in the stacking direction (the Z-axis direction). The memory circuit 18 is disposed in the circuit formation layer 44 in the stacking direction. The memory circuit 18 includes: a semiconductor memory 181 such as a DRAM (Dynamic Random Access Memory); and a wiring line 182.

The outer edge 12K of the logic chip 12 is positioned on the outer side with respect to the outer edge 20K of the effective pixel region R20 in the stacking direction (the Z-axis direction) of the sensor board 20 and the circuit board 10.

[Workings and Effects of Solid-State Imaging Unit 2]

As described above, in the solid-state imaging unit 2 according to the present embodiment, both the effective portion 121 and the dummy portion 122 of the logic chip 12 of the circuit board 10A are so positioned as to overlap the effective pixel region R20 of the sensor board 20 in the stacking direction. Moreover, both the effective portion 141 and the dummy portion 142 of the memory chip 42 of the circuit board 40 are so positioned as to overlap the effective pixel region R20. Therefore, according to the solid-state imaging unit 2, it is allowed to reduce warpage, deformation, or the like of the solid-state imaging unit 2 as a whole, as with the solid-state imaging unit 1. Accordingly, the solid-state imaging unit 2 according to the present embodiment ensures high dimensional accuracy and is allowed to take in a favorable image as well.

It is to be noted that both the logic chip 12 of the circuit board 10A and the memory chip 42 of the circuit board 40 are so positioned as to overlap the effective pixel region R20 in the solid-state imaging unit 2 according to the present embodiment. This makes it possible to further reduce warpage, deformation, or the like of the unit as a whole, compared to the solid-state imaging unit 1. It is to be noted that only either the logic chip 12 of the circuit board 10A or the memory chip 42 of the circuit board 40 may occupy the position overlapping the effective pixel region R20. In this case, however, it is preferable that the logic chip 12 of the circuit board 10A, which is bonded to the sensor board 20, occupy the position overlapping the effective pixel region R20, as in a solid-state imaging unit 2A according to a fourth modification example of the present disclosure (Modification example 4) illustrated in FIG. 7. A reason for this is that it is more effective in terms of reduction in warpage, deformation, or the like of the unit as a whole.

4. Third Embodiment: Example of Application to Electronic Apparatus

FIG. 8 is a block diagram illustrating a configuration example of a camera 2000 which is an electronic apparatus to which the present technology is applied.

The camera 2000 includes: an optical unit 2001 including a lens group, etc.; an imaging unit (an imaging device) 2002 to which the above-described solid-state imaging unit 1, 1A to 1C, 2, 2A, or the like (hereinafter referred to as the solid-state imaging unit 1 or the like) is applied; and a DSP (Digital Signal Processor) circuit 2003 which is a camera signal processing circuit. The camera 2000 also includes a frame memory 2004, a display 2005, a recorder 2006, an operation unit 2007, and a power source 2008. The DSP circuit 2003, the frame memory 2004, the display 2005, the recorder 2006, the operation unit 2007, and the power source 2008 are coupled to each other via a bus line 2009.

The optical unit 2001 takes in entering light (image light) from an object and forms an image on an imaging plane of the imaging unit 2002. The imaging unit 2002 converts a light amount of the entering light, which is formed into the image on the imaging plane by the optical unit 2001, to an electric signal on a pixel-unit basis, and outputs the electric signal as a pixel signal.

The display 2005 includes, for example, a panel display device such as a liquid crystal panel or an organic EL panel. The display 2005 displays, for example, a moving image or a still image captured by the imaging unit 2002. The recorder 2006 causes the moving image or the still image captured by the imaging unit 2002 to be recorded in a recording medium such as a hard disk or a semiconductor memory.

The operation unit 2007 outputs an operation command regarding a variety of functions of the camera 2000 under operation by a user. The power source 2008 appropriately supplies a variety of powers to serve as respective operation powers for the DSP circuit 2003, the frame memory 2004, the display 2005, the recorder 2006, and the operation unit 2007, to these targets of supply.

As described above, the use of the above-described solid-state imaging unit 1 or the like as the imaging unit 2002 leads to an expectation of acquiring a favorable image.

5. Example of Application to Mobile Body

A technology (the present technology) according to the present disclosure is applicable to various products. For example, the technology according to the present disclosure may be implemented as a unit to be mounted on any kind of mobile bodies including an automobile, an electric automobile, a hybrid electric automobile, a motorcycle, a bicycle, a personal mobility, an aircraft, a drone, a vessel, a robot, etc.

FIG. 9 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 9, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 9, an audio speaker 12061, a display section 12062, and an instrument panel 12063 are illustrated as the output device. The display section 12062 may, for example, include at least one of an on-board display and a head-up display.

FIG. 10 is a diagram depicting an example of the installation position of the imaging section 12031.

In FIG. 10, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 10 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the forgoing, described is one example of the vehicle control system to which the technology according to the present disclosure is applicable. The technology according to the present disclosure is applicable to the imaging section 12031 among the above-described components. Specifically, the solid-state imaging unit 1 illustrated in FIG. 1A, etc. or the like is applicable to the imaging section 12031. The application of the technology according to the present disclosure to the imaging section 12031 leads to an expectation of a superior operation of the vehicle control system.

6. Other Modification Examples

Although description has been given above of the present disclosure with reference to the embodiments and their modification examples, the present disclosure is not limited to the above-described embodiments, etc. and may be modified in a variety of ways. For example, in the solid-state imaging unit 1 of the above-described first embodiment, the description has been given of the logic chip 12 where neither the semiconductor device 151 nor the wiring line 152 is present in the dummy portion 122 as an example; however, the present disclosure is not limited thereto. According to the present disclosure, the dummy portion 122 may include a dummy circuit 15A including the semiconductor device 151 and the wiring line 152 as in, for example, a solid-state imaging unit 1D according to a fifth modification example (Modification example 5) of the present disclosure illustrated in FIG. 11. The dummy circuit 15A is disposed in the circuit formation layer 14. The dummy circuit 15A is not to be used during, for example, normal operation of the solid-state imaging unit 1D but is usable as a redundant circuit, which is to be used in a case where an abnormality such as a failure is caused in the logic circuit 15.

Moreover, according to the present disclosure, the dummy portion 122 may include a dummy circuit 15B including only the wiring line 152 as in, for example, a solid-state imaging unit 1E according to a sixth modification example (Modification example 6) of the present disclosure illustrated in FIG. 12. The dummy circuit 15B is disposed in the circuit formation layer 14. Alternatively, according to the present disclosure, the dummy portion may include only the semiconductor device out of the semiconductor device and the wiring line.

Moreover, in the above-described embodiments, etc., the description has been given, as an example, of a case where the outer edge 12K of the logic chip 12 and the outer edge 42K of the memory chip 42 are each present at the position on the outer side with respect to the position of the outer edge 20K of the effective pixel region R20; however, the present disclosure is not limited thereto. For example, the outer edge 12K of the logic chip 12 and the outer edge 42K of the memory chip 42 may each be present exactly at a position in alignment with the outer edge 20K of the effective pixel region R20 in the stacking direction.

Moreover, the locations, the dimensions, the shapes, etc. of the components including the circuit boards 10 and 40, the sensor board 20, etc. described in the above-described embodiments, etc. may be set as desired.

Moreover, in the above-described embodiments, etc. the logic circuit and the memory circuit have been taken as examples of the signal processing circuit; however, the present disclosure is not limited thereto. The signal processing circuit according to the present disclosure includes, for example, one or more of a logic circuit, a memory circuit, a power circuit, an image signal compression circuit, a clock circuit, and an optical communication conversion circuit.

Moreover, in the above-described second embodiment, a structure where: the circuit board 10 including the logic chip 12; and the circuit board 40 including the memory chip 42 are stacked in this order from a position close to the sensor board 20 has been taken as an example; however, the present disclosure does not intend to limit the stacking order. That is, for example, in the solid-state imaging unit 2 illustrated in FIG. 6A, the circuit board 10, the circuit board 40, and the sensor board 20 may be stacked in order.

It is to be noted that effects described herein are merely examples, and the description thereof is non-limiting. Further, any other effect may be provided. Moreover, the present technology may have the following configurations.

(1)
An imaging unit including
a stacked structure that includes
a sensor board having an effective pixel region where an imaging device is disposed, the imaging device including a plurality of pixels and being configured to receive external light in each of the pixels to generate a pixel signal, and
a circuit board including a chip, the chip including a first portion and a second portion that are integrated with each other, the first portion including a signal processing circuit that performs signal processing of the pixel signal, the second portion being disposed at a position different from a position of the first portion in an in-plane direction, in which
both the first portion and the second portion are positioned to overlap the effective pixel region in a stacking direction of the sensor board and the circuit board.

(2)
The imaging unit according to (1) described above, in which an outer edge of the chip is positioned to overlap an outer edge of the effective pixel region in the stacking direction of the sensor board and the circuit board or is positioned on outer side with respect to the outer edge of the effective pixel region in the stacking direction of the sensor board and the circuit board.

(3)
The imaging unit according to (1) or (2) described above, further including a wiring line that electrically couples the imaging device and the signal processing circuit to each other.

(4)
The imaging unit according to (3) described above, in which
the wiring line includes a first wiring-line portion and a second wiring-line portion, the first wiring-line portion being disposed in the sensor board and being exposed on a surface of the sensor board, the second wiring-line portion being disposed in the circuit board and being exposed on a surface of the circuit board, and
the first wiring-line portion and the second wiring-line portion are bonded to each other.

(5)
The imaging unit according to any one of (1) to (4) described above, in which the signal processing circuit in the first portion includes a first semiconductor device that contributes to the signal processing of the pixel signal, and the second portion includes a dummy circuit including a second semiconductor device.

(6)
The imaging unit according to (5) described above, in which the circuit board includes a single semiconductor substrate and a circuit formation layer that is disposed on the semiconductor substrate and in which the signal processing circuit and the dummy circuit are formed.

(7)
The imaging unit according to any one of (1) to (6) described above, in which the stacked structure further includes a third board stacked on opposite side of the sensor board to the circuit board.

(8)
The imaging unit according to any one of (1) to (7) described above, in which the signal processing circuit includes one or more of a logic circuit, a memory circuit, a power circuit, an image signal compression circuit, a clock circuit, and an optical communication conversion circuit.

(9)
An electronic apparatus including an imaging unit, the imaging unit including:
a stacked structure that includes
a sensor board having an effective pixel region where an imaging device is disposed, the imaging device including a plurality of arranged pixels and being configured to receive external light to generate a pixel signal, and
a circuit board including a first portion and a second portion that are integrated with each other, the first portion including a signal processing circuit that performs signal processing of the pixel signal, the second portion being disposed at a position different from a position of the first portion in an in-plane direction, in which
both the first portion and the second portion are positioned to overlap the effective pixel region in a stacking direction of the sensor board and the circuit board.

This application claims priority to Japanese Patent Application No. JP2018-51318 filed with the Japan Patent Office on Mar. 19, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging unit, comprising
a stacked structure that includes:
   a sensor board that includes having an effective pixel region, wherein
      the effective pixel region includes an imaging device,
      the imaging device includes a plurality of pixels, and
      the imaging device is configured to receive external light in each pixel of the plurality of pixels to generate a pixel signal; and
   a circuit board that includes a chip, wherein
      the chip includes a first portion and a second portion,
      the first portion is integrated with the second portion,
      the first portion includes a signal processing circuit,
      the signal processing circuit includes a first semiconductor device configured to execute signal processing of the pixel signal,
      the second portion is at a position different from a position of the first portion in an in-plane direction on the circuit board,
      the second portion includes a dummy circuit including a second semiconductor device, and
      both the first portion and the second portion overlap the effective pixel region in a stacking direction of the sensor board and the circuit board.

2. The imaging unit according to claim 1, wherein an outer edge of the chip one of:
   overlaps an outer edge of the effective pixel region in the stacking direction of the sensor board and the circuit board, or
   is on an outer side with respect to the outer edge of the effective pixel region in the stacking direction of the sensor board and the circuit board.

3. The imaging unit according to claim 1, further comprising a wiring line configured to electrically couple the imaging device to the signal processing circuit.

4. The imaging unit according to claim 3, wherein
the wiring line includes a first wiring-line portion and a second wiring-line portion,
the sensor board includes the first wiring-line portion,
the first wiring-line portion is exposed on a surface of the sensor board,
the circuit board includes the second wiring-line portion,
the second wiring-line portion is exposed on a surface of the circuit board, and
the first wiring-line portion is bonded to the second wiring-line portion.

5. The imaging unit according to claim 1, wherein
the circuit board further includes:
   a single semiconductor substrate; and
   a circuit formation layer on the single semiconductor substrate, and
the circuit formation layer includes the signal processing circuit and the dummy circuit.

6. The imaging unit according to claim 1, wherein
the stacked structure further includes a third board on an opposite side of the circuit board, and
the circuit board is between the third board and the sensor board.

7. The imaging unit according to claim 1, wherein the signal processing circuit further includes at least one of a logic circuit, a memory circuit, a power circuit, an image signal compression circuit, a clock circuit, or an optical communication conversion circuit.

8. An electronic apparatus, comprising:
an imaging unit, wherein the imaging unit includes:
   a stacked structure that includes:
      a sensor board that includes having an effective pixel region, wherein
         the effective pixel region includes an imaging device,
         the imaging device includes a plurality of pixels, and
         the imaging device is configured to receive external light in each pixel of the plurality of pixels to generate a pixel signal; and
      a circuit board that includes a first portion and a second portion, wherein
         the first portion is integrated with the second portion,
         the first portion includes a signal processing circuit,
         the signal processing circuit includes a first semiconductor device configured to execute signal processing of the pixel signal,
         the second portion is at a position different from a position of the first portion in an in-plane direction on the circuit board,
         the second portion includes a dummy circuit including a second semiconductor device, and
         both the first portion and the second portion overlap the effective pixel region in a stacking direction of the sensor board and the circuit board.

* * * * *